(12) United States Patent
Yang et al.

(10) Patent No.: US 8,362,501 B2
(45) Date of Patent: Jan. 29, 2013

(54) LIGHT-EMITTING DEVICE

(75) Inventors: Hung-Chih Yang, Hsinchu (TW);
Yu-Jiun Shen, Hsinchu (TW);
Hsin-Mao Liu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 124 days.

(21) Appl. No.: 12/769,744

(22) Filed: Apr. 29, 2010

(65) Prior Publication Data
US 2010/0276724 A1 Nov. 4, 2010

(30) Foreign Application Priority Data

Apr. 29, 2009 (TW) ................................ 98114206 A

(51) Int. Cl.
*H01L 33/22* (2010.01)
(52) U.S. Cl. .................. 257/94; 257/13; 257/95
(58) Field of Classification Search ............ 257/94–103, 257/13, 21, 79, 436, E33.067, E33.072, E33.074; 438/22–29
See application file for complete search history.

(56) References Cited

U.S. PATENT DOCUMENTS

| | | | | |
|---|---|---|---|---|
| 6,954,031 B2* | 10/2005 | Hashimoto et al. | | 313/503 |
| 6,969,634 B2* | 11/2005 | Bao | | 438/99 |
| 7,187,007 B2* | 3/2007 | Kim et al. | | 257/79 |
| 7,692,203 B2* | 4/2010 | Konno et al. | | 257/96 |
| 7,825,577 B2* | 11/2010 | Hsu et al. | | 313/498 |
| 2001/0048113 A1* | 12/2001 | Kim | | 257/98 |
| 2005/0082562 A1* | 4/2005 | Ou et al. | | 257/103 |
| 2007/0202624 A1* | 8/2007 | Yoon et al. | | 438/29 |
| 2008/0035953 A1* | 2/2008 | Beom et al. | | 257/103 |
| 2009/0072259 A1* | 3/2009 | Chen et al. | | 257/98 |

FOREIGN PATENT DOCUMENTS

TW I320607 2/2010

* cited by examiner

*Primary Examiner* — Cuong Q Nguyen
*Assistant Examiner* — Yosef Gebreyesus
(74) *Attorney, Agent, or Firm* — Muncy, Geissler, Olds & Lowe, PLLC

(57) ABSTRACT

The application illustrates a light-emitting device including a contact layer and a current spreading layer on the contact layer. A part of the contact layer is a rough structure and a part of the contact layer is a flat structure. A part of the current spreading layer is a rough structure and a part of the current spreading layer is a flat structure. The rough region of the contact layer and the rough region of the current spreading layer are substantially overlapped.

11 Claims, 5 Drawing Sheets

US 8,362,501 B2

LIGHT-EMITTING DEVICE

CROSS REFERENCE TO RELATED APPLICATIONS

This application claims the right of priority based on Taiwan Patent Application No. 098114206 entitled "Light-Emitting Device", filed on Apr. 29, 2009, which is incorporated herein by reference and assigned to the assignee herein.

TECHNICAL FIELD

The present application generally relates to a light-emitting device, and more particularly to a light-emitting device structure with good current spreading effect and high light extraction efficiency.

BACKGROUND

The light-emitting diode is widely applied in the domestic electronic appliances, the indicator for the instrument, light sources for the optoelectronic products, and the optoelectronic communication due to its low electricity consumption, low heat dissipation, long operating life-time, strike-proof, small volume, rapid response speed. The light-emitting diode also has good optoelectronic characteristics such as stable wavelength of the color light.

In a conventional light-emitting diode structure, a contact layer is normally formed to provide a lower contact resistance between an electrode and a semiconductor structure below the electrode. When an electrode is formed on the contact layer, the ohmic contact is formed as a result of a lower contact resistance of the junction between the electrode and the contact layer. The contact layer has a higher doped impurity concentration than those of other semiconductor epitaxy layers, such as a cladding layer. When the ohmic contact is formed between the contact layer and the electrode, the light-emitting diode has lower forward voltage and higher light-emitting efficiency. The light-emitting efficiency of the light-emitting diode is the product of the internal quantum efficiency and the light extraction efficiency. In general, the internal quantum efficiency related to the property of the material and the quality of the epitaxy layers. The light extraction efficiency related to the index of refraction of the material and the flatness of the surface. To increase the light extraction efficiency, a contact layer having roughing surface can be formed directly by the epitaxy technology. It can reduce the probability of the total reflection of the light emitted from the active layer and increase more than 30% of the light extraction efficiency. A current spreading layer is formed on the contact layer to increase the effect of the current spreading, but the effect of the current spreading can be decreased when the surface of the current spreading layer is not flat.

The FIG. 5 illustrates a known light-emitting apparatus showing a light-emitting apparatus 600 including at least a submount 60 with a solder 62 and an electrical connecting structure 64 on the submount 60. The light-emitting device 400 is adhered on the submount 60 by the solder 62, and the first electrode 56 and the second electrode 66 of the light-emitting device 400 are electrically connected with an electrical connecting structure 64 and the submount 60 respectively. Except for the submount 60, the package carrier can also be a lead frame or mounting carrier convenient for the circuit design of the light-emitting apparatus and the high heat dispersion.

SUMMARY

The present application provides an optoelectronic device including a contact layer, wherein a part of the contact layer is a rough structure and a part of the contact layer is a flat structure.

The present application provides an optoelectronic device including a current spreading layer, wherein a part of the current spreading layer is a rough structure and a part of the current spreading layer is a flat structure.

The present application provides an optoelectronic device wherein the surface morphology of the contact layer and the surface morphology of the current spreading layer are substantially the same.

The present application provides an optoelectronic device wherein the rough region of the contact layer and the rough region of the current spreading layer are substantially overlapped.

The foregoing aspects and many of the attendant purpose, technology, characteristic, and function of this application will become more readily appreciated as the same becomes better understood by reference to the following embodiments detailed description, when taken in conjunction with the accompanying drawings.

DETAILED DESCRIPTION OF THE PREFERRED EMBODIMENTS

Figure 1:
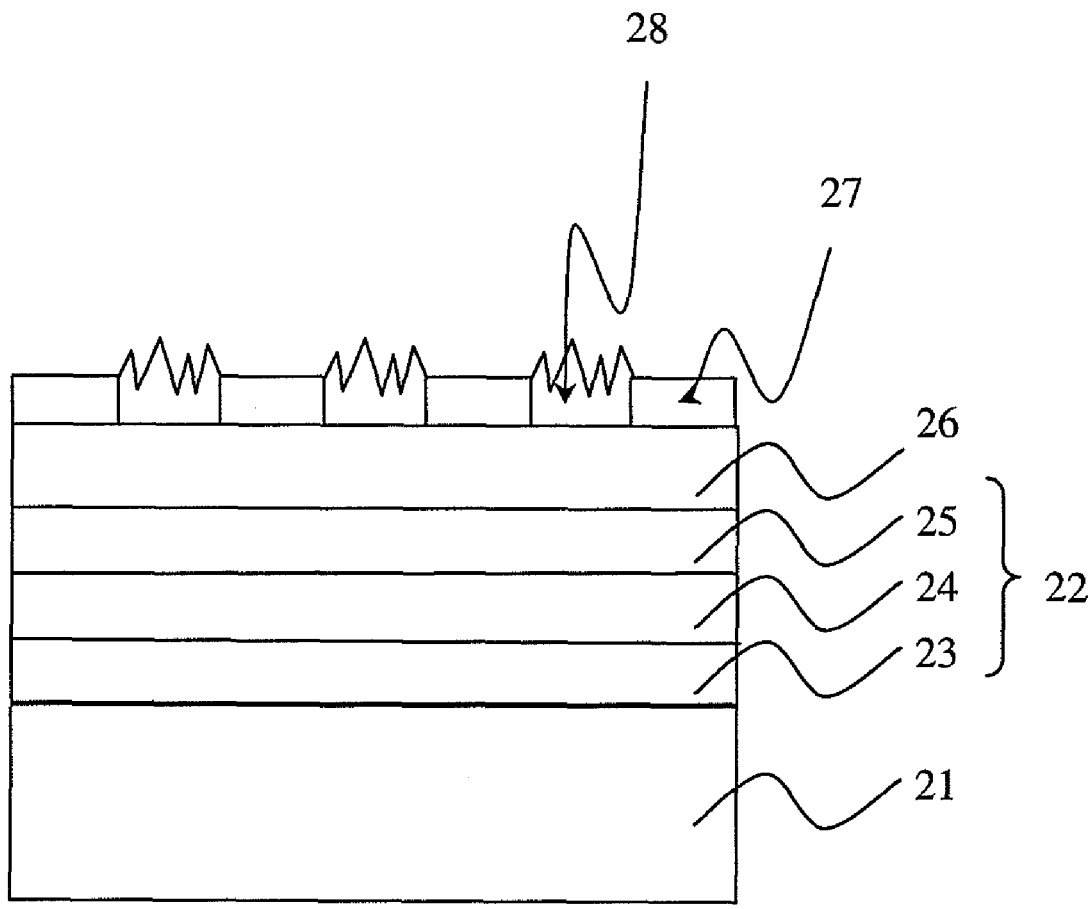
FIGS. 1-3 illustrate a process flow of forming a light-emitting device in accordance with one embodiment of the present application.
Figure 2:
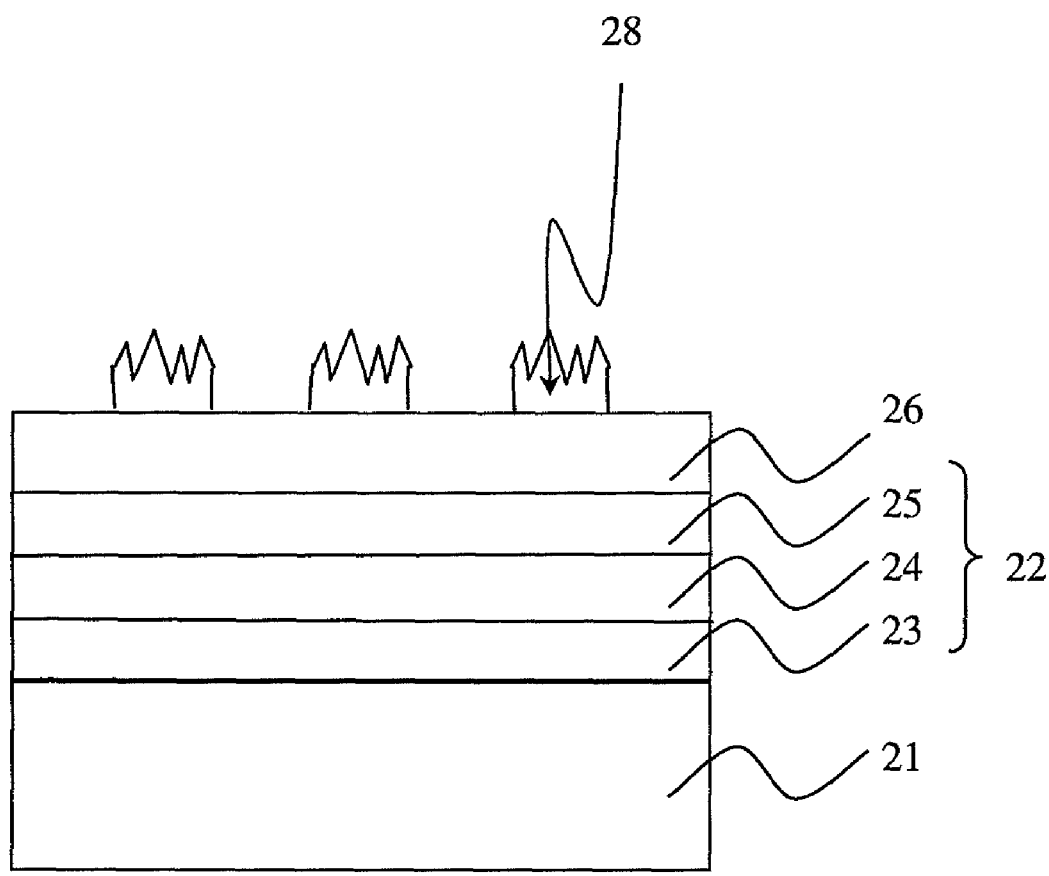
Figure 3:
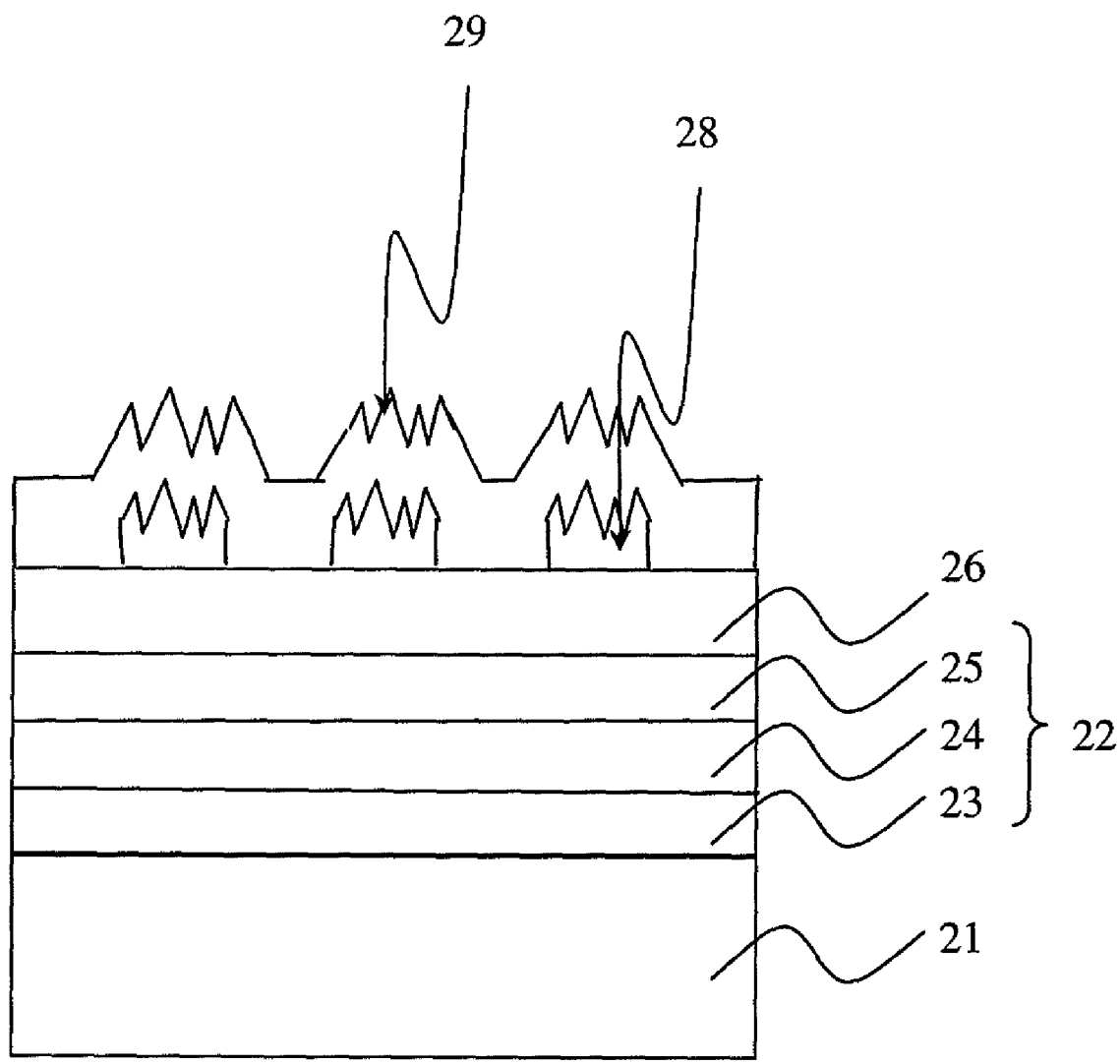

A process flow of forming a light-emitting device in accordance with the first embodiment of the present application is illustrated from FIG. 1 to FIG. 3. Referring to FIG. 1 which shows a growth substrate 21 made of material like GaAs, Si, SiC, Sapphire, InP, GaP, AlN, or GaN. Then a semiconductor epitaxy structure 22 is formed on the growth substrate 21 by the epitaxial process such as MOCVD, LPE, or MBE epitaxial process. The material of the semiconductor epitaxy structure comprising one or more elements selected from the group consisting of gallium, aluminum, indium, arsenic, phosphorous, nitrogen, and silicon. The semiconductor epitaxy structure 22 includes a first conductivity type semiconductor layer 23, an active layer 24, and a second conductivity type semiconductor layer 25. Besides, the active layer 24 in this embodiment can be a homostructure, a single heterostructure, a double heterostructure, or a multiple quantum well structure.

After forming a flat contact layer 26 on the semiconductor epitaxy structure 22, using a photoresist material such as oxide or nitride to form a patterned photoresist layer 27 on the flat contact layer 26 to cover a part of the flat contact layer. A rough contact layer 28 is formed on the region of the flat contact layer 26 uncovered by the patterned photoresist layer. After removing the patterned photoresist layer 27, the rough contact layer 28 is formed as shown in FIG. 2. Finally, a current spreading layer 29 is formed on the rough contact layer and the region previously covered by the patterned photoresist layer by deposition method or chemical vapor deposition, and the material of the current spreading layer can be indium tin oxide, indium oxide, tin oxide, cadmium tin oxide, zinc oxide, magnesium oxide, or titanium nitride. A part of the top surface of the current spreading layer is a rough structure, and part of that is a flat structure. Because the current spreading layer is formed by following the morphology of the contact layer, the morphology of the current spreading layer and the morphology of the contact layer are substantially the same as shown in FIG. 3. The region of the rough structure has high light extraction efficiency, and the region of the flat structure has good current spreading effect.

Figure 4:
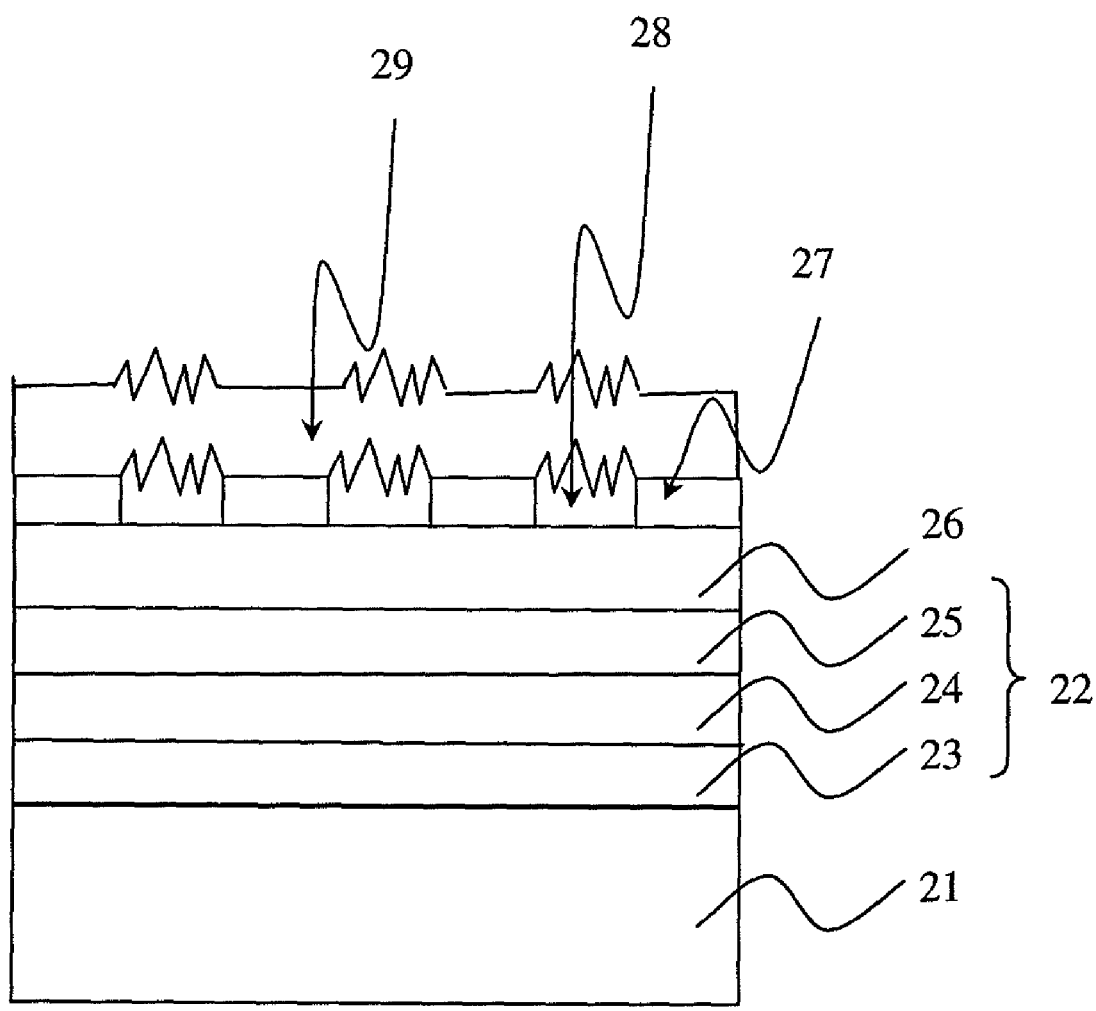
FIG. 4 illustrates a structure of the light-emitting device in accordance with other embodiment of the present application.
Figure 5:
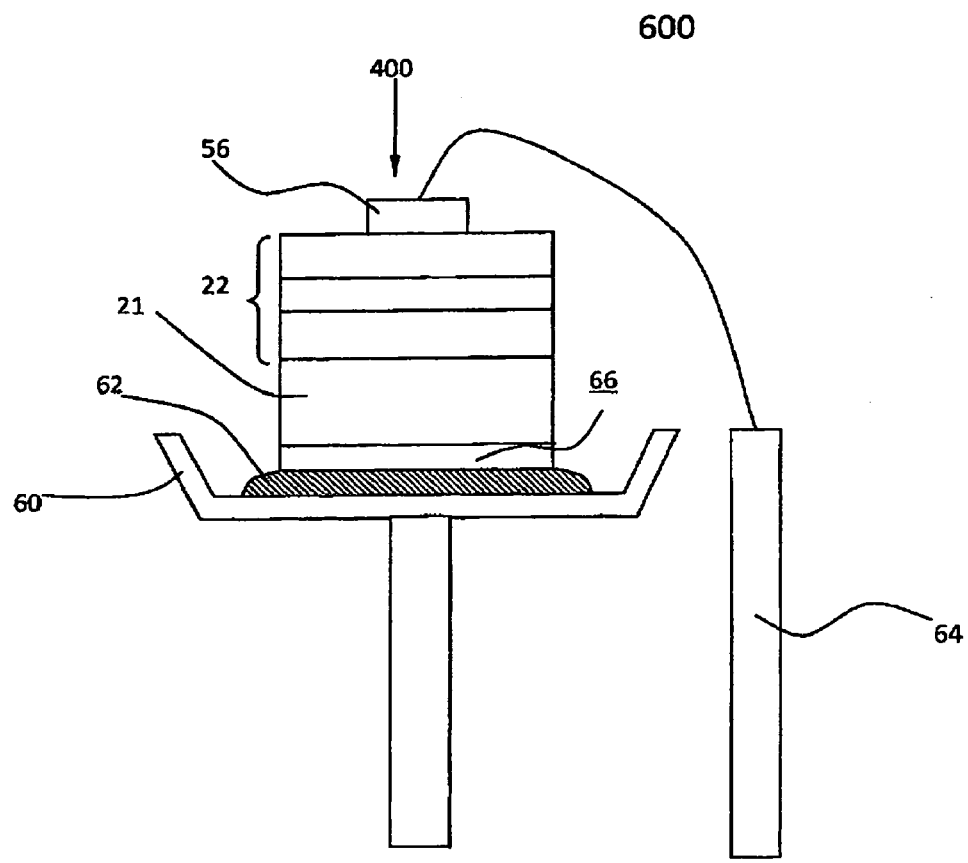
FIG. 5 illustrates a known light-emitting apparatus.

FIG. 4 illustrates a structure of the light-emitting device in accordance with the second embodiment of the present application. The difference compared with the above first embodiment is that the patterned photoresist layer 27 is not removed after forming the rough contact layer 28 on the region of the flat contact layer 26 uncovered by the patterned photoresist layer. Then a current spreading layer 29 is formed on the patterned photoresist layer 27 and rough contact layer 28 by deposition method or chemical vapor deposition. A part of the top surface of the current spreading layer is a rough structure, and part of that is a flat structure. Because the current spreading layer is formed by following the morphology of the contact layer, the morphology of the current spreading layer and the morphology of the contact layer are substantially the same as shown in FIG. 4. The region of the rough structure has high light extraction efficiency, and the region of the flat structure has good current spreading effect.

Other embodiments of the application will be apparent to those having ordinary skill in the art from consideration of the specification and practice of the invention disclosed herein. It is intended that the specification and examples be considered as exemplary only, with a true scope and spirit of the invention being indicated by the following claims.

We claim:

1. A light-emitting device comprising:
   a semiconductor structure;
   a contact layer on the semiconductor structure, including:
      a rough region having a top surface and sidewalls;
      a flat region having a top surface and sidewalls;
      wherein the top surface of the rough region is a rough surface, and the top surface of the flat region is a flat surface; and
   a current spreading layer on the contact layer, including a rough region and a flat region; the rough region of the contact layer is substantially directly under the rough region of the current spreading layer; the flat region of the contact layer is substantially directly under the flat region of the current spreading layer.

2. The light-emitting device according to claim 1, wherein the material of the semiconductor structure comprising one or more elements selected from the group consisting of gallium, aluminum, indium, arsenic, phosphorous, nitrogen, and silicon.

3. The light-emitting device according to claim 1, wherein the semiconductor structure further including a first conductivity type semiconductor layer, an active layer, and a second conductivity type semiconductor layer.

4. The light-emitting device according to claim 1, wherein the contact layer further including:
   a flat contact layer on the semiconductor structure; and
   a rough contact layer on the flat contact layer, comprising the rough region and the flat region.

5. The light-emitting device according to claim 4, wherein the flat region of the rough contact layer comprising a patterned photoresist layer.

6. The light-emitting device according to claim 5, wherein the patterned photoresist layer can be oxide or nitride.

7. The light-emitting device according to claim 1, wherein the current spreading layer can be indium tin oxide, indium oxide, tin oxide, cadmium tin oxide, zinc oxide, magnesium oxide, or titanium nitride.

8. The light-emitting device according to claim 1, further comprising a substrate below the semiconductor structure.

9. The light-emitting device according to claim 8, wherein the substrate can be GaAs, Si, SiC, Sapphire, InP, GaP, MN, or GaN.

10. The light-emitting device according to claim 1, wherein the morphology of the current spreading layer and the morphology of the contact layer are substantially the same.

11. The light-emitting device according to claim 1, wherein the current spreading layer is a partially rough layer.

* * * * *